United States Patent
Chehrazi et al.

(10) Patent No.: US 6,654,301 B2
(45) Date of Patent: Nov. 25, 2003

(54) MULTIPLE DISCHARGE CAPABLE BIT LINE

(75) Inventors: Farzad Chehrazi, San Jose, CA (US); Shaishav A. Desai, San Jose, CA (US); Anup S. Mehta, Fremont, CA (US); Devendra N. Tawari, Bangalore (IN)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/965,307

(22) Filed: Sep. 27, 2001

(65) Prior Publication Data

US 2003/0058721 A1 Mar. 27, 2003

(51) Int. Cl.[7] .................................................. G11C 7/00
(52) U.S. Cl. ........................................ 365/204; 365/63
(58) Field of Search .................................. 365/204, 63

(56) References Cited

U.S. PATENT DOCUMENTS

| | | | | |
|---|---|---|---|---|
| 3,765,002 A | | 10/1973 | Basse ................... 340/173 CA |
| 4,785,423 A | * | 11/1988 | Skupnjak et al. ....... 365/185.17 |
| 5,434,822 A | * | 7/1995 | Deleganes et al. ...... 365/189.11 |
| 5,706,237 A | * | 1/1998 | Ciraula et al. ............... 365/204 |
| 5,835,432 A | | 11/1998 | Nakano ....................... 365/205 |
| 6,108,233 A | * | 8/2000 | Lee et al. .................... 365/154 |
| 6,353,560 B1 | * | 3/2002 | Morikawa ................. 365/185.2 |
| 6,370,072 B1 | * | 4/2002 | Dennard et al. ............. 365/203 |
| 6,504,774 B2 | * | 1/2003 | Yoon et al. .................. 365/203 |

FOREIGN PATENT DOCUMENTS

| | | | |
|---|---|---|---|
| EP | 0 399 362 A2 | 11/1990 | ............. G11C/7/00 |
| EP | 0 496 523 A2 | 7/1992 | ............ G11C/17/12 |

OTHER PUBLICATIONS

International Search Report, dated Dec. 23, 2002, 4 pages.

* cited by examiner

Primary Examiner—Richard Elms
Assistant Examiner—Toan Le
(74) Attorney, Agent, or Firm—Rosenthal & Osha L.L.P.

(57) ABSTRACT

A bit line that has a feedback path from the bit line to a storage cell on the bit line is provided. The feedback path allows the bit line to discharge through a discharge device that is connected to a non-discharging local bit line. Further, a discharge device capable of discharging a global bit line even when a storage cell connected to the discharge device is not being evaluated is provided. Further, a method to perform a memory array operation by discharging a bit line using multiple discharge devices is provided.

16 Claims, 6 Drawing Sheets

MULTIPLE DISCHARGE CAPABLE BIT LINE

BACKGROUND OF INVENTION

Figure 1:
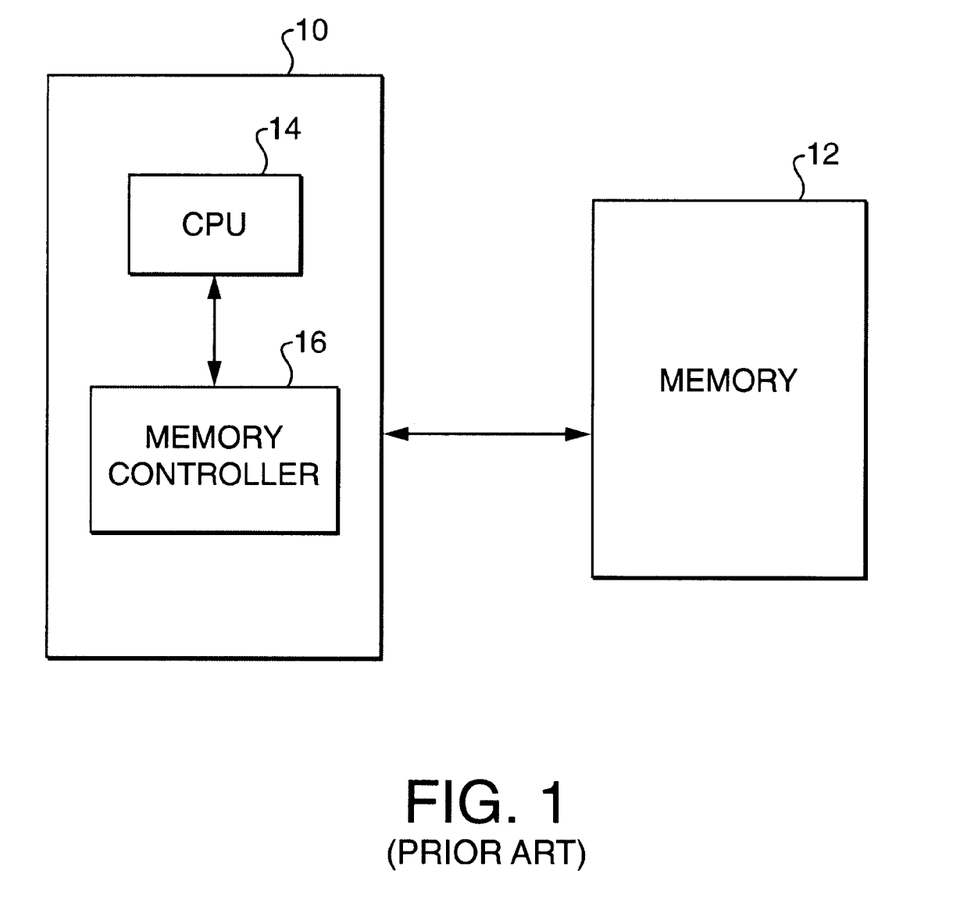
FIG. 1 shows a typical computer system.

A typical computer system has at least a microprocessor and memory. The microprocessor processes, i.e., executes, instructions to accomplish various tasks of the computer system. Such instructions, along with the data required by the microprocessor when executing these instructions, are stored in some form of memory. FIG. 1 shows a typical computer system having a microprocessor (10) and some form of memory (12). The microprocessor (10) has, among other things, a central processing unit (also known and referred to as "CPU" or "execution unit") (14) and a memory controller (also known as "load/store unit") (16). The CPU (14) is where the actual arithmetic and logical operations of the computer system take place. To facilitate the execution of operations by the CPU (14), the memory controller (16) provides the CPU (14) with necessary instructions and data from the memory (12). The memory controller (16) also stores information generated by the CPU (14) into the memory (12).

Memory, as shown in FIG. 1, is typically formed by numerous storage cells, where each storage cell contains a bit of data. Memory organized in such a fashion is called a "memory array." The data in each storage cell can have either a logic low value, i.e., '0,' or a logic high value, i.e., '1.' As a result, the value(s) of one or more storage cells are often used to represent numbers, characters, instructions, etc. Accordingly, to ensure that data in a storage cell is properly read and stored, important consideration must be afforded to how a memory array is designed.

Figure 2:
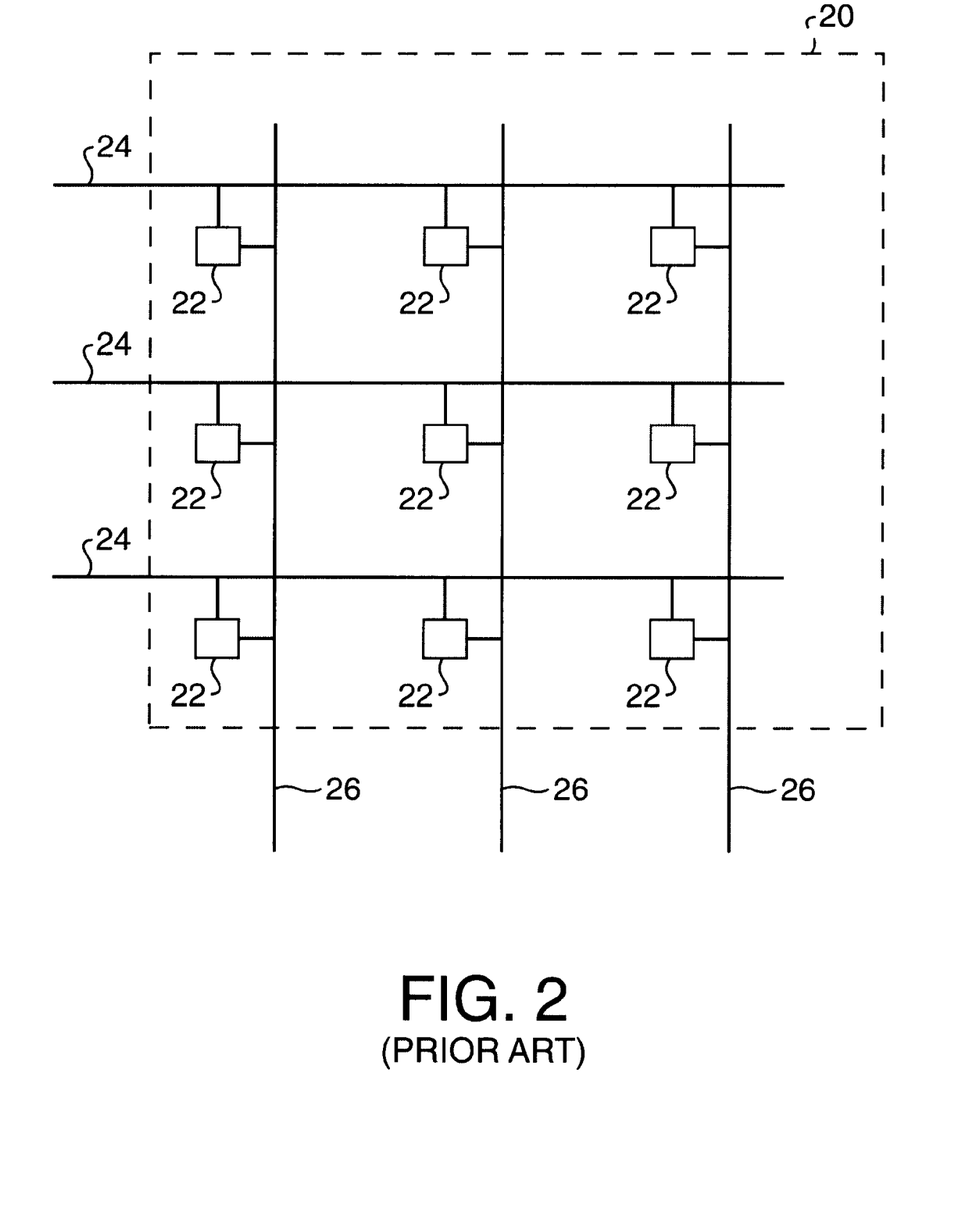
FIG. 2 shows a typical memory array.

FIG. 2 shows a typical implementation of a memory array (20). The memory array (20) has numerous storage cells (also known and referred to as "memory elements") (22), where each storage cell (22) is connected to a bit line (also known as "row line") (24) and a word line (also known as "column line") (26). A storage cell (22) is selected for a read/write operation by some combination of activating the bit line (24) connected to the storage cell (22) and activating the word line (26) connected to the storage cell (22).

Accurately and quickly reading data from a memory array, such as the one shown in FIG. 2, is challenging because of both large physical sizes of the memory array and a high number of entries, i.e., storage cells, in the memory array. A typical implementation used by designers to increase read operation performance is to pre-charge a bit line to a logic high value, i.e., '1,' prior to a read operation (also referred to as "pre-charge phase"), and then to perform, i.e., evaluate, the read operation (also referred to as "evaluation phase") on a particular storage cell by allowing the bit line connected to the particular storage cell to discharge if the particular storage cell holds a '0' value. If, however, the bit line does not discharge, it implies that the particular storage cell connected to the bit line holds a '1' value. Therefore, reading a '1' takes relatively no time to evaluate because the bit line is already pre-charged to a '1.' However, reading a '0' is more time-intensive because the bit line, which is long and loaded in a large memory array, has to discharge from to a logic low value from a logic high value in order for the read operation to evaluate to a '0.'

One approach used by designers to increase read operation performance involves pre-charging a bit line to some intermediate value between logic low and logic high in order to reduce the amount of charge that needs to be discharged during an evaluation phase (this approach is referred to as "sense amplifier approach"). Although this approach results in faster read operations than in cases where the bit line is pre-charged to a logic high value, this approach requires sensitive circuitry that is prone to malfunction due to unexpected but likely fabrication and environment variations.

Figure 3:
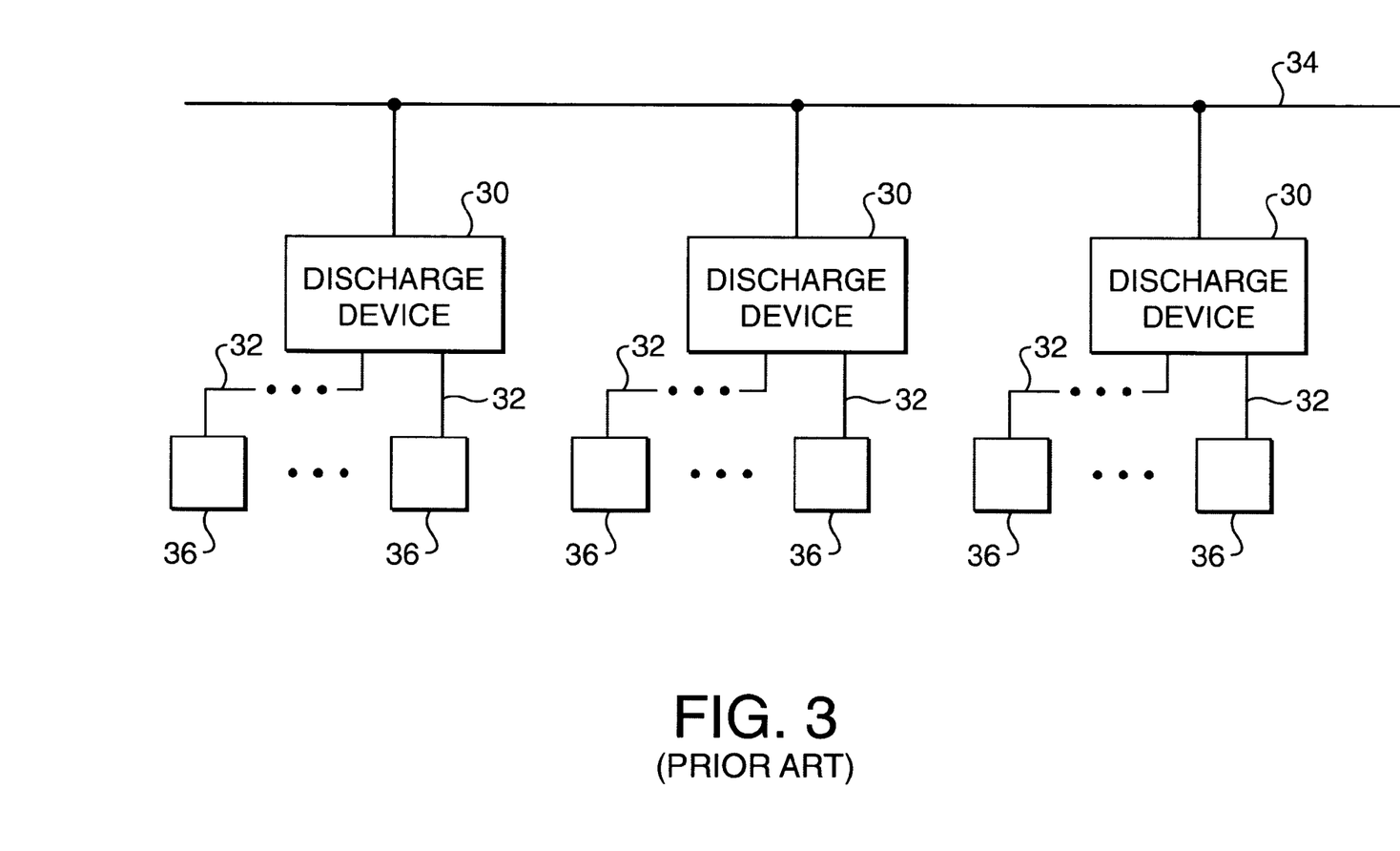
FIG. 3 shows a typical implementation of discharge devices on a bit line.

Another approach used by designers to increase read operation performance involves dividing a bit line into smaller "local" bit lines as opposed to using a continuous bit line (hereinafter "full-rail") for the read operation (this approach is referred to as "split bit line approach"). The local bit lines, through some circuitry (discussed below with reference to FIG. 3), are connected to a "global" bit line. Because the storage cells are connected to the local bit lines, the global bit line is less loaded. However, this approach is relatively slow because the global bit line can discharge through only one path opened by one local bit line. In other words, if a storage cell contains a '0,' and that storage cell is then read, the local bit line connected to the storage cell must discharge before the global bit line can discharge. This approach is less prone to malfunction than the sense amplifier approach discussed above.

Regarding the split bit line approach discussed above, FIG. 3 shows a typical implementation of discharge devices (30) that are used to connect local bit lines (32) to a global bit line (34). During an evaluation phase of a read operation, if a storage cell (36) holding a '0' value is evaluated, the local bit line (32) associated with the storage cell (36) signals the discharge device (30) connected to the local bit line (32) to discharge the global bit line (34) connected to that discharge device (30). In this case, the global bit line (34) is discharged, i.e., driven low, by one discharge device (30). Although this implementation results in less load on a global bit line, this implementation is slow because a discharge device along the global bit line has to be designed to individually discharge portions of the global bit line that are not directly connected to the discharge device. It follows that this implementation results in slower memories and consequently, slower computer systems.

SUMMARY OF INVENTION

According to one aspect of the present invention, a memory array having a global bit line comprises a discharge device connected to the global bit line and a feedback path from the global bit line to another discharge device connected to the global bit line.

According to another aspect, a method for performing a memory array operation comprises discharging a local bit line, using a pull down stage to discharge a global bit line when the local bit line discharges, and using feedback from the global bit line to another pull down stage to cause the another pull down stage to further discharge the global bit line.

According to another aspect, a structure for a bit line comprises at least one discharge device connected to the bit line, at least one memory element connected to the at least one discharge device, and a feedback path from the bit line to another discharge device connected to the bit line.

According to another aspect, a discharge device for a memory array comprises a pre-charge node, logic connected to at least one local bit line, where a value on the pre-charge node sets the logic during a pre-charge phase, and a global internal node, where a value on the global internal node is set by the logic.

According to another aspect, a bit line structure for a memory array comprises a discharging means for discharging a bit line using a discharge device, and a feedback means for further discharging the bit line when the discharging means discharges the bit line.

According to another aspect, a method for discharging a bit line using multiple discharge paths comprises discharging the bit line through a discharge path provided by a discharge device connected to the bit line, and further discharging the bit line through another discharge path provided by another discharge device connected to the bit line, where feedback from the bit line signals the another discharge device to further discharge the bit line.

According to another aspect, a method for discharging a bit line using multiple discharge paths comprises a discharging step for discharging the bit line through a discharge device, a feedback step for signaling another discharge device, and another discharging step for further discharging the bit line through the another discharge device.

Other aspects and advantages of the invention will be apparent from the following description and the appended claims.

DETAILED DESCRIPTION

The present invention relates to an approach for using feedback to discharge a global bit line through a discharge device that is not connected to a discharging local bit line. The present invention further relates to a method and apparatus for having multiple discharge paths for a bit line when that bit line needs to be discharged.

Particularly, the present invention relates to an approach for a memory array read operation in which information from a particular discharge device is fed back to other discharge devices along a global bit line when a read operation is performed on a storage cell connected to the particular discharge device. For example, along a particular global bit line in a memory array, when a discharge device beings to discharge a local bit line due to a read operation on a storage cell holding a '0' value, a signal is sent to other discharge devices along the global bit line that causes the other discharge devices to allow the global bit line to discharge. Thus, because there is feedback from a global bit line to discharge devices along the global bit line, discharge devices along the global bit line are dependent on their own local bit lines and the global bit line to turn 'on' a discharge path on the global bit line.

Figure 4:
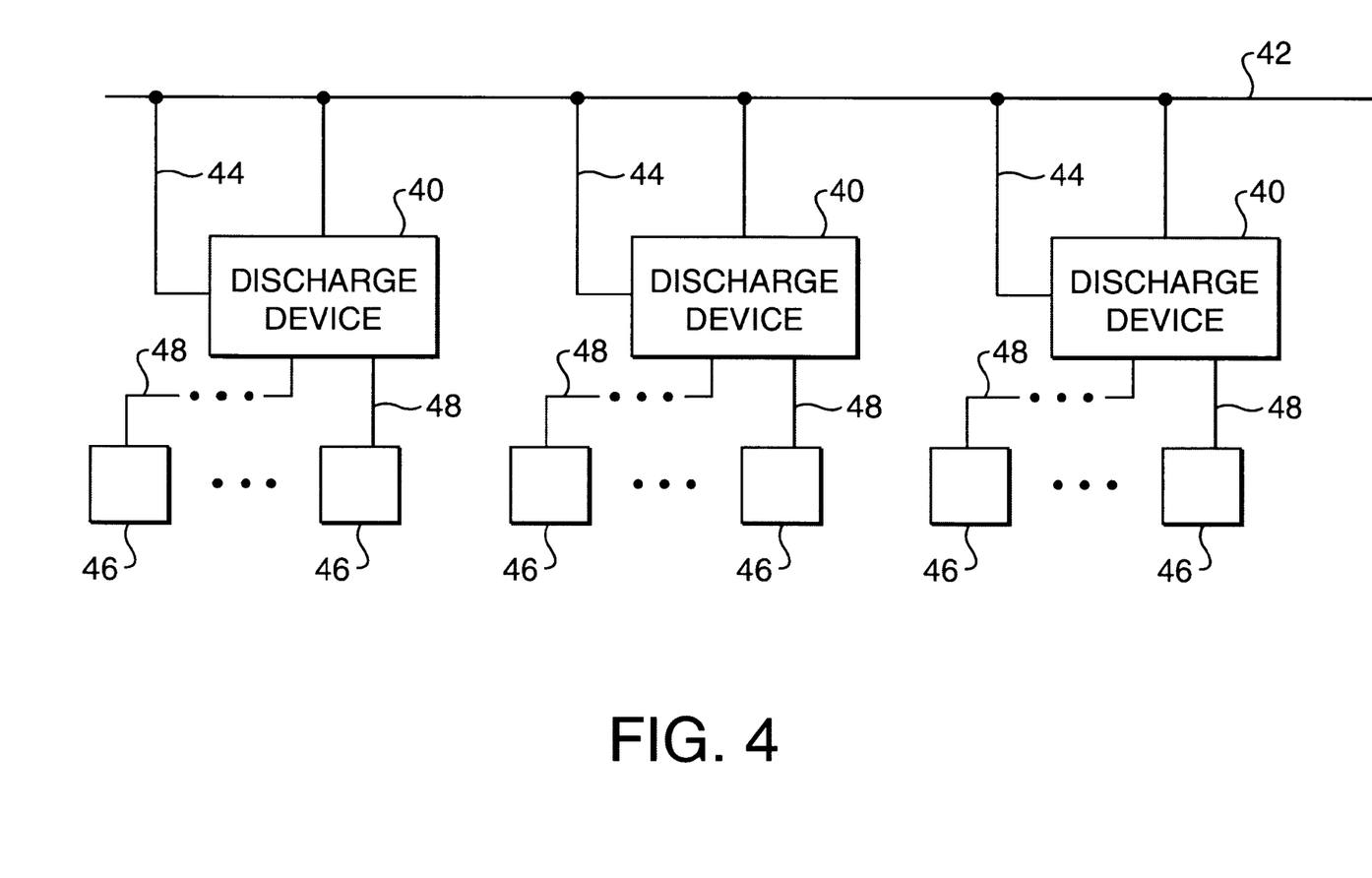
FIG. 4 shows a diagram in accordance with an embodiment of the present invention.

FIG. 4 shows an exemplary diagram in accordance with an embodiment of the present invention. In a memory array, one or more discharge devices (also referred to as "pull down stages") (40) (these pull down stages are connected to local bit lines that are respectively connected to individual storage cells) are connected to a global bit line (42) (also shown in FIG. 4 as GLOBAL_BIT_LINE). During a read operation, one of the pull down stages (40) begins discharging the global bit line (42) when a storage cell (46) discharges a local bit line (48) connected to that pull down stage (40). As the portion of the global bit line (42) connected to this pull down stage (40) discharges, feedback paths (44) from the global bit line (42) to the pull down stages (40) are used to signal the remaining pull down stages (40) to discharge the portions of the global bit line (42) to which they are connected. Those skilled in the art will appreciate that using pull down stages as discussed above accelerates the discharge of the global bit line.

Figure 5:
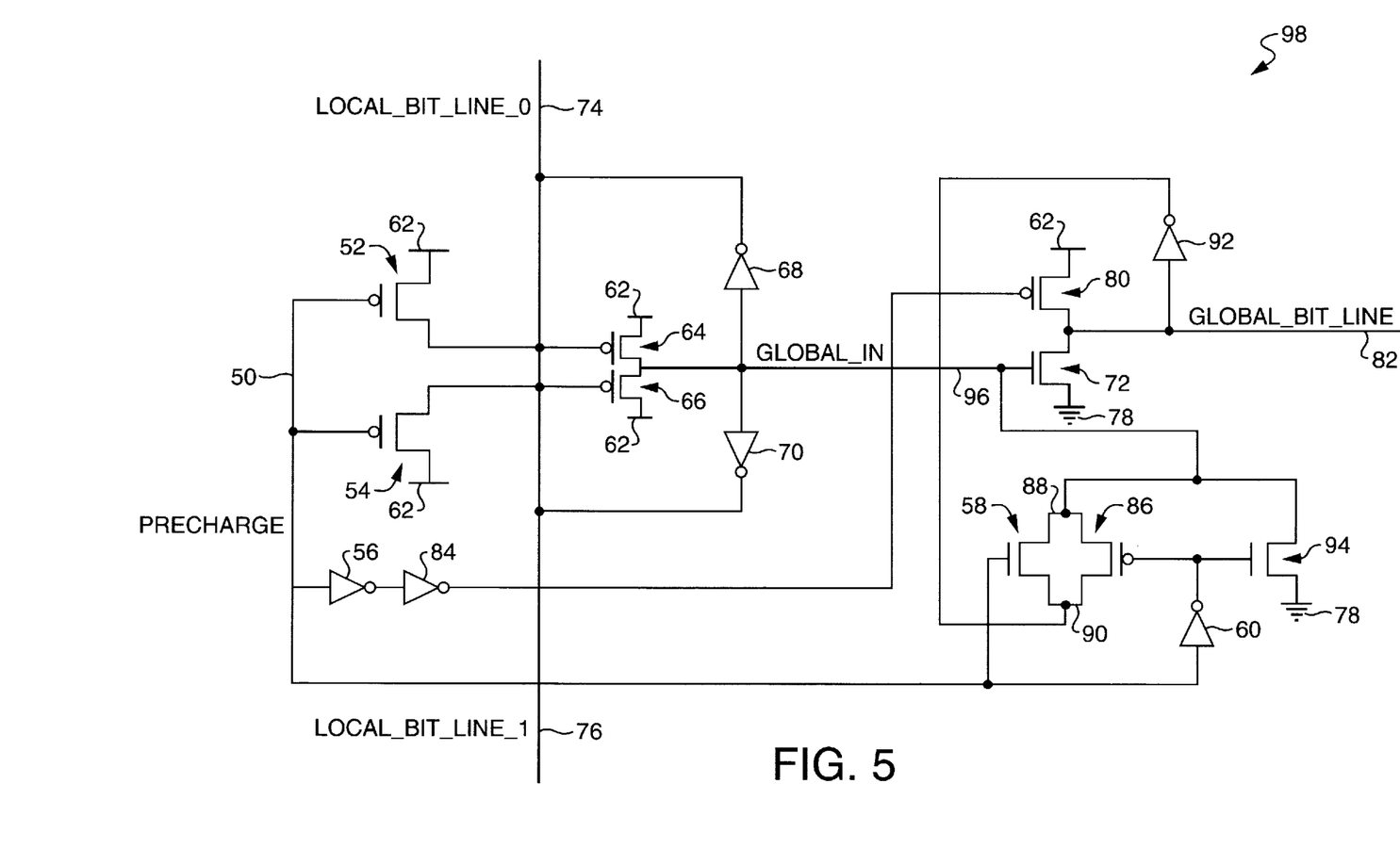
FIG. 5 shows a circuit schematic in accordance with an embodiment of the present invention.

FIG. 5 shows an exemplary circuit schematic of a pull down stage (98) in accordance with an embodiment of the present invention. A pre-charge node (50) (also shown in FIG. 5 as PRECHARGE) serves as an input to a first PMOS transistor (52), a second PMOS transistor (54), a first inverter (56), a first NMOS transistor (58), and a second inverter (60). The first PMOS transistor (52) has a terminal connected to power (62) (also referred to as "connected to high"), and another terminal connected to an input to a third PMOS transistor (64). The second PMOS transistor (54) has a terminal connected to high (62) and another terminal connected to an input to a fourth PMOS transistor (66).

The third and fourth PMOS transistors (64, 66) each have a terminal connected to high (62) and another terminal connected to a global internal node (96) (also shown in FIG. 5 as GLOBAL_IN). The global internal node (96) serves as an input to a third inverter (68), an input to a fourth inverter (70), and an input to a second NMOS transistor (72). The third inverter (68) outputs to a first local bit line (74) (also shown in FIG. 5 as LOCAL_BIT_LINE 0). The first local bit line (74) serves as an input to the third PMOS transistor (64). The fourth inverter (70) outputs to another local bit line (76) (also shown in FIG. 5 as LOCAL_BIT_LINE_1). The another local bit line (76) serves as an input to the fourth PMOS transistor (66). The second NMOS transistor (72) has a terminal connected to ground (78) (also referred to as "connected to low") and another terminal connected to both a terminal of a fifth PMOS transistor (80) and a global bit line (82) (also shown in FIG. 5 as GLOBAL_BIT_LINE).

The first inverter (56) outputs to a fifth inverter (84), which, in turn, outputs to an input to the fifth PMOS transistor (80). The fifth PMOS transistor (80), in addition to having a terminal connected to both a terminal of the second NMOS transistor (72) and the global bit line (82), has a terminal connected to high (62).

The first NMOS transistor (58) has a terminal connected to a terminal of a sixth PMOS transistor (86) (this connected terminal is referred to as "first joint terminal") and another terminal connected to another terminal of the sixth PMOS transistor (86) (this connected terminal is referred to as "second joint terminal"). The first joint terminal (88) is connected to the global internal node (96). The second joint terminal (90) is connected to an output of a sixth inverter (92).

The sixth inverter (92) inputs a value on the global bit line (82). The second inverter (60) outputs to both an input to the sixth PMOS transistor (86) and to an input to a third NMOS transistor (94). The third NMOS transistor (94) has a terminal connected to low (78) and another terminal connected to the global internal node (96).

During a pre-charge phase, the pre-charge node (50) is low. The low value on the pre-charge node (50) causes the first and second PMOS transistors (52, 54) to switch or remain 'on.' During the pre-charge phase, the local bit lines (74, 76) are pre-charged high, which, in turn, causes the third and fourth PMOS transistors (64, 66) to switch or remain 'off.'

The first inverter (56) inputs the low value on the pre-charge node (50) and outputs high to the fifth inverter (84), which, in turn, outputs low on the input to the fifth PMOS transistor (80) causing the fifth PMOS transistor (80) to switch 'on.' As the fifth PMOS transistor (80) switches 'on,' the global bit line (82) goes high due to a connection to high (62) through the fifth PMOS transistor (80).

The low value on the pre-charge node (50) causes the second inverter (60) to output high on the input to the third NMOS transistor (94) causing the third NMOS transistor (94) to switch 'on.' As the third NMOS transistor (94) switches 'on,' the global internal node (96) is held low by a connection to ground (78) through the third NMOS transistor (94).

During an evaluation phase, the pre-charge node (50) goes high. The high value on the pre-charge node (50) causes the first and second PMOS transistors (52, 54) to switch 'off.' If a storage cell (not shown) connected to the pull down stage (98) holds a '0' and is evaluated during the evaluation phase, then one of the local bit lines (74, 76) gets discharged. If it is the first local bit line (74) that gets discharged, the third PMOS transistor (64) switches 'on' and the global internal node (96) goes high due to a connection to high (62) through the third PMOS transistor (64). If it is the second local bit line (76) that gets discharged, the fourth PMOS transistor (66) switches 'on' and the global internal node (96) goes high due to a connection to high (62) through the fourth PMOS transistor (66).

The high value on the pre-charge node (50) causes the first inverter (56) to output low on the input to the fifth inverter (84), which, in turn, outputs high on the input to the fifth PMOS transistor (80) causing the fifth PMOS transistor (80) to switch 'off.' The high value on the global internal node (96) causes the second NMOS transistor (72) to switch 'on.' As the second NMOS transistor (72) switches 'on,' the global bit line (82) discharges because it gets connected to ground (78) through the second NMOS transistor (72).

As the global bit line (82) discharges, the sixth inverter (92) outputs high on the second joint terminal (90). The high value on the pre-charge node (50) causes the second inverter (60) to output low on the input to the sixth PMOS transistor (86) causing the sixth PMOS transistor (86) to switch 'on.' As the sixth PMOS transistor (86) switches 'on,' the global internal node (96) is held high by the output of the sixth inverter (92). Because the global internal node (96) is held high, the second NMOS transistor (72) remains 'on' to allow the global bit line (82) to discharge.

Thus, in summary, when a storage cell connected to the pull down stage (98) is evaluated to a '0' value, a local bit line connected to the storage cell (not shown) is discharged causing the pull down stage (98) to discharge the global bit line (82). Further, the pull down stage (98) has added functionality (discussed below) that enables the pull down stage (98) to help discharge the global bit line (82) even when a storage cell connected to the pull down stage (98) is not evaluated.

In the case that a storage cell connected to the pull down stage (98) is not evaluated, if another, similar pull down stage (not shown) elsewhere along the global bit line (82) discharges the global bit line (82), the pull down stage (98) uses feedback to discharge the global bit line (82) along with other, similar pull down stages (not shown) along the global bit line (82). When a storage cell connected to another pull down stage (not shown) on the global bit line (82) evaluates to a '0' value, that pull down stage begins to discharge the global bit line (82) as previously explained. This voltage drop on the global bit line (82) causes the sixth inverter (92) to begin to output high on the second joint terminal (90). Because the sixth PMOS transistor (86) is 'on' during the evaluation phase, the global internal node (96) goes high due to its connection to the output of the sixth inverter (92) through the sixth PMOS transistor (86). As the global internal node (96) goes high, the second NMOS transistor (72) switches 'on,' which, in turn, provides the global bit line (82) with another discharge path to ground (78). Thus, those skilled in the art will appreciate that the global bit line (82) can further discharge though the pull down stage (98) even though the local bit lines (74, 76) connected to the pull down stage (98) do not discharge.

Figure 6:
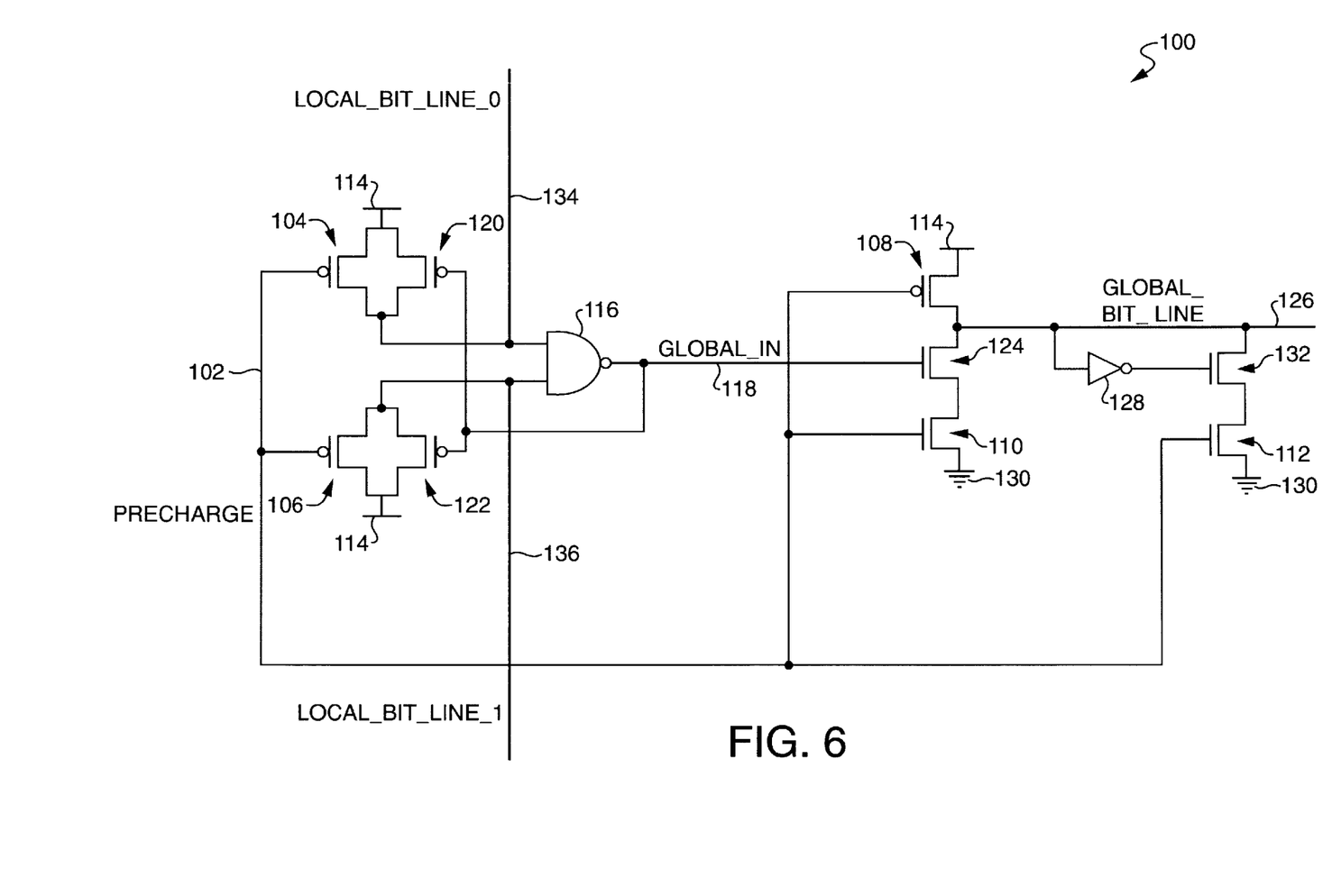
FIG. 6 shows a circuit schematic in accordance with another embodiment of the present invention.

FIG. 6 shows an exemplary circuit schematic of a pull down stage (100) in accordance with another embodiment of the present invention. A pre-charge node (102) (also shown in FIG. 6 as PRECHARGE) serves as an input to a first PMOS transistor (104), a second PMOS transistor (106), a third PMOS transistor (108), a first NMOS transistor (110), and a second NMOS transistor (112). The first PMOS transistor (104) has a terminal connected to power (114) (also referred to as "connected to high (114)") and another terminal connected to a first input to a NAND gate (116). The second PMOS transistor (106) has a terminal connected to high (114) and another terminal connected to a second input to the NAND gate (116). Further, a first local bit line (134) (also shown in FIG. 6 as LOCAL_BIT_LINE_0) is connected to the first input to the NAND gate (116) and a second local bit line (136) (also shown in FIG. 6 as LOCAL_BIT_LINE_1) is connected to the second input to the NAND gate (116).

The NAND gate (116) outputs on a global internal node (118) (also shown in FIG. 6 as GLOBAL_IN). The global internal node (118) serves as an input to a fifth PMOS transistor (120), a sixth PMOS transistor (122), and a third NMOS transistor (124). The fifth PMOS transistor (120) has a terminal connected to high (114) and another terminal connected to the first input to the NAND gate (116).

The sixth PMOS transistor (120) has a terminal connected to high (114) and another terminal connected to the second input to the NAND gate (116).

The third PMOS transistor (108) has a terminal connected to high (114) and another terminal connected to both a global bit line (126) (also shown in FIG. 6 as GLOBAL_IN) and a terminal of the third NMOS transistor (124). The third NMOS transistor (124), in addition to having a terminal connected to the global bit line (126), has another terminal connected to a terminal of the first NMOS transistor (110). The first NMOS transistor (110), in addition to having a terminal connected to a terminal of the third NMOS transistor (124), has another terminal connected to ground (130) (also referred to as "connected to low (130)").

The global bit line (126) is connected to an input to an inverter (128). The inverter (128) outputs to an input to a fourth NMOS transistor (132). The fourth NMOS transistor (132) has a terminal connected to the global bit line (126) and another terminal connected to a terminal of the second NMOS transistor (112).

The second NMOS transistor (112), in addition to having a terminal connected to a terminal of the fourth NMOS transistor (132), has a terminal connected to low (130).

During a pre-charge phase, the pre-charge node (102) is low. The low value on the pre-charge node (102) causes the first and second PMOS transistors (104, 106) to switch or remain 'on.' When the first and second PMOS transistors (104, 106) are switched 'on,' the first and second inputs to the NAND gate (116) go high due to a connection to high (114) through the first and second PMOS transistors (104, 106), respectively.

The logic low value on the pre-charge node (102) during the pre-charge phase further causes the third PMOS transistor (108) to switch 'on.' As the third PMOS transistor (108) switches 'on,' the global bit line (126) goes high due to a connection to high (114) through the third PMOS transistor (108).

During an evaluation phase, the pre-charge node (102) goes high. The high value on the pre-charge node (102) causes the first and second PMOS transistors (104, 106) to switch 'off.' If a storage cell (not shown) connected to the pull down stage (100) holds a '0' and is evaluated during this evaluation phase, then one of the local bit lines (134, 136) gets discharged. If either of the local bit lines (134, 136) discharge, the NAND gate (116) outputs high on the global internal node (118). As the global internal node (118) goes high, the third NMOS transistor (124) switches 'on.' Because the first NMOS transistor (110) switches 'on' due to the pre-charge node (102) going high at the beginning of the evaluation phase, the global bit line (126) discharges due to a connection to low (130) through the 'on' first and third NMOS transistors (110, 124).

When the global bit line (126) discharges, the inverter (128) outputs high on the input to the fourth NMOS transistor (132) causing the fourth NMOS transistor (132) to switch 'on.' Because the second NMOS transistor (112) switches 'on' due to the pre-charge node (102) going high at the beginning of the evaluation phase, the global bit line (126) is held low by a connection to ground (130) through the 'on' second and fourth NMOS transistors (112, 132).

Thus, in summary, when a storage cell connected to the pull down stage (100) is evaluated to a '0' value, a local bit line connected to the storage cell is discharged causing the pull down stage (100) to discharge the global bit line (126). Further, the pull down stage (100) has added functionality (discussed below) in that the pull down stage (100) may help further discharge the global bit line (126) when another, similar pull down stage (not shown) connected to the global bit line (126) discharges the global bit line (126).

In the case that a storage cell connected to the pull down stage (100) is not evaluated, if another, similar pull down stage (not shown) connected elsewhere along the global bit line (126) discharges the global bit line (126), the pull down stage (100) uses feedback to operate so as to discharge the global bit line (126) along with other, similar pull down stages (not shown) connected along the global bit line (100). When a storage cell connected to another pull down stage (not shown) on the global bit line (126) evaluates to a '0' value, that pull down stage begins to discharge the global bit line (126) as previously explained. This causes the inverter (128) to output high on the input to the fourth NMOS transistor (132), which, in turn, switches 'on.' As the fourth NMOS transistor (132) switches 'on,' the global bit line (126) an additional discharge path is provided for the global bit line (126) through a connection to ground (130) through the 'on' second and fourth NMOS transistors (112, 132). Thus, those skilled in the art will appreciate that the global bit line (126) can further discharge though the pull down stage (100) even though the local bit lines (134, 136) connected to the pull down stage (100) do not discharge.

Advantages of the present invention may include one or more of the following. In some embodiments, because discharge devices, other than a discharge device connected to a storage cell being evaluated, may discharge a global bit line, the global bit line discharges faster than when only the discharge device connected to the storage cell being evaluated is used to discharge the global bit line.

In some embodiments, because a global bit line discharges faster, read operations in a memory array may be performed more quickly.

In some embodiments, because feedback from a global bit line to discharge devices along the global bit line is used to indicate to the discharge devices that the global bit line needs to be discharged, the discharge devices may collectively discharge the global bit line.

In some embodiments, because a local bit line is used to help perform memory array operations, a global bit line having feedback paths to discharge devices is less loaded than in cases when a split bit line approach is not used for memory array operations.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A memory array, comprising:
   a discharge device having an output directly connected to a global bit line;
   at least one other discharge device having an output directly connected to the global bit line, wherein the at least one other discharge device comprises a feedback path from the output of the at least one other discharge device, and wherein the output of the at least one other discharge device is dependent on the feedback path.

2. The memory array of claim 1, wherein the at least one other discharge device comprises:
   pre-charging logic adapted to pre-charge the global bit line during a pre-charge phase; and
   discharging logic adapted to discharge the global bit line upon an occurrence of at least one selected from a group consisting of a local bit line discharge during an evaluation phase and a discharge of the global bit line by the discharge device.

3. The memory array of claim 2, wherein the discharge of the global bit line by the discharge device is detected by the at least one other discharge device through the feedback path.

4. The memory array of claim 2, wherein the discharge device is operatively connected to a storage cell by a local bit line, and wherein the local bit line discharge occurs when the storage cell discharges the local bit line during the evaluation phase.

5. The memory array of claim 2, wherein the at least one other discharge device is operatively coupled to the global bit line.

6. A method for performing a memory array operation, comprising:
   discharging a local bit line;
   operating a first pull down stage to discharge a global bit line in response to the discharging of the local bit line;
   operating at least one other pull down stage comprising a feedback path from the global bit line; and
   discharging the global bit line dependent on the feedback path.

7. The method of claim 6, wherein a storage cell associated with the first pull down stage discharges the local bit line during an evaluation phase.

8. The method of claim 6, wherein the at least one other pull down stage is operatively connected to the global bit line.

9. A structure for a bit line, comprising:
- at least one discharge device having an output directly connected to the bit line;
- at least one memory element operatively connected to the at least one discharge device; and
- at least one other discharge device having an output directly connected to the bit line and comprising a feedback path from the bit line, wherein the output of the at least one other discharge device is dependent on the feedback path.

10. The structure of claim 9, wherein the at least one memory element causes the at least one discharge device to discharge the bit line when the at least one memory element holds a logic low value during an evaluation phase.

11. The structure of claim 9, wherein the at least one memory element is operatively connected to the at least one discharge device by a second bit line.

12. A discharge device for a memory array, comprising:
- a pre-charge node adapted to pre-charge a global bit line;
- logic connected to at least one local bit line, the logic adapted to be set by a value on the pre-charge node during a pre-charge phase, the logic adapted to remain set if the at least one local bit line does not discharge during an evaluation phase, the logic adapted to set a value on a global internal node, the logic adapted to cause the global bit line to discharge if the at least one local bit line discharges during the evaluation phase;
- a feedback path from the global bit line, wherein the discharge device is adapted to further discharge the global bit line via an output of the discharge device, and wherein the output is dependent on the feedback path.

13. A bit line structure for a memory array, comprising:
- a discharging means for discharging a bit line;
- at least one other discharging means for further discharging the bit line, wherein the at least one other discharging means comprises a feedback means from the global bit line, and wherein the further discharging of the bit line is dependent on the feedback mean.

14. The bit line structure of claim 13, wherein the feedback means uses another discharge device.

15. A method for discharging a bit line using multiple discharge paths, comprising:
- discharging the bit line through a discharge path provided by a discharge device connected to the bit line; and
- further discharging the bit line through another discharge path provided by another discharge device connected to the bit line, wherein the another discharge device comprises a feedback path from the bit line, and wherein the further discharging is dependent on the feedback path.

16. A method for discharging a bit line using multiple discharge paths, comprising:
- a discharging step for discharging the bit line through a discharge device; and
- another discharging step for further discharging the bit line through the another discharge device, wherein the another discharge device comprises a feedback path from the bit line, and wherein the another discharging step is dependent on the feedback path.

* * * * *

UNITED STATES PATENT AND TRADEMARK OFFICE
CERTIFICATE OF CORRECTION

PATENT NO. : 6,654,301 B2
DATED : November 25, 2003
INVENTOR(S) : Farzad Chebhrazi et al.

It is certified that error appears in the above-identified patent and that said Letters Patent is hereby corrected as shown below:

<u>Title page,</u>
Item [75], Inventors, replace "San Jose" with -- Sunnyvale --.

Signed and Sealed this

Thirtieth Day of March, 2004

JON W. DUDAS
*Acting Director of the United States Patent and Trademark Office*